(12) United States Patent
Hsu

(10) Patent No.: US 8,610,137 B2
(45) Date of Patent: Dec. 17, 2013

(54) ORGANIC LIGHT EMITTING DISPLAY MODULE AND PRODUCING METHOD THEREOF

(75) Inventor: Hsu-Sheng Hsu, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 4 days.

(21) Appl. No.: 13/214,250

(22) Filed: Aug. 22, 2011

(65) Prior Publication Data

US 2012/0319140 A1    Dec. 20, 2012

(30) Foreign Application Priority Data

Jun. 20, 2011   (TW) .............................. 100121414 A

(51) Int. Cl.
*H01L 33/08* (2010.01)
*H01R 43/00* (2006.01)

(52) U.S. Cl.
USPC .................. 257/88; 257/E33.012; 29/825

(58) Field of Classification Search
USPC ................. 257/88, E33.012; 29/825
See application file for complete search history.

(56) References Cited

U.S. PATENT DOCUMENTS

| | | | |
|---|---|---|---|
| 6,734,928 B2 | 5/2004 | Ito et al. | |
| 2004/0046184 A1* | 3/2004 | Yanagawa et al. | 257/200 |
| 2005/0093001 A1* | 5/2005 | Liu et al. | 257/79 |
| 2007/0059901 A1* | 3/2007 | Majumdar et al. | 438/455 |
| 2007/0200497 A1* | 8/2007 | Matsudate et al. | 313/512 |

FOREIGN PATENT DOCUMENTS

| | | |
|---|---|---|
| CN | 1564637 | 1/2005 |
| CN | 101826498 | 9/2010 |
| JP | 2009-38334 | 2/2009 |
| TW | 200722860 | 6/2007 |

OTHER PUBLICATIONS

Translation of CN101826498.*
Translation of CN101826498, published Sep. 8, 2010.*
"Office Action of China Counterpart Application", issued on Dec. 7, 2012, p. 1-p. 4.

* cited by examiner

*Primary Examiner* — Whitney T Moore
(74) *Attorney, Agent, or Firm* — Jianq Chyun IP Office

(57) ABSTRACT

An organic light emitting diode (OLED) display module including a first carrier, a second carrier and an OLED display panel is provided. The second carrier disposed on the first carrier is integrally formed with the first carrier. The OLED display panel is disposed on the second carrier. A continuous joint surface is formed between the first and the second carriers. A producing method of the OLED display module is also provided.

13 Claims, 5 Drawing Sheets

ORGANIC LIGHT EMITTING DISPLAY MODULE AND PRODUCING METHOD THEREOF

CROSS-REFERENCE TO RELATED APPLICATION

This application claims the priority benefit of Taiwan application serial no. 100121414, filed on Jun. 20, 2011. The entirety of the above-mentioned patent application is hereby incorporated by reference herein and made a part of this specification.

BACKGROUND OF THE INVENTION

1. Field of the Invention

The invention relates to a frame structure. Particularly, the invention relates to a frame structure of an organic light emitting diode display module.

2. Description of Related Art

Information and communication technology (ICT) industry has become today's mainstream industry, and since a flat-panel display serves as a communication interface between man and information, development of the display is very important. Since an organic light emitting diode (OLED) display has features and advantages of self-luminous, wide viewing angle, fast response time, low operation voltage, suitable for low temperature operation and high photoelectric conversion efficiency, etc., it is expected to become a mainstream of displays of the next generation.

In the conventional OLED display, a frame structure thereof is rather complicated, which results in a high cost and the frame structure cannot be lighted and thinned.

SUMMARY OF THE INVENTION

The invention is directed to an organic light emitting diode (OLED) display module, which has simplified frame structure.

The invention is directed to a method for manufacturing an OLED display module, which achieves a low manufacturing cost through a simplified frame structure.

The invention provides an OLED display module including a first carrier, a second carrier, and an OLED display panel. The second carrier is disposed on the first carrier and is formed integrally with the first carrier. A continuous joint surface is formed between the first carrier and the second carrier.

The invention provides a method for manufacturing an OLED display module including following steps. A first carrier and a second carrier are jointed, and the bonded first carrier and the second carrier are stamped to form a frame, and an OLED display panel is assembled to the frame.

In an embodiment of the invention, the second carrier has at least one notch. A distance of the notch relative to the first carrier is substantially greater than a distance of the continuous joint surface relative to the first carrier.

In an embodiment of the invention, the first carrier and the second carrier form a frame, and the frame has a bottom plate and a side plate adjoined to the bottom plate, and the notch is located between the bottom plate and the side plate.

In an embodiment of the invention, the first carrier and the second carrier are aligned at the side plate.

In an embodiment of the invention, the second carrier includes a surface back to the first carrier, and a joint of the bottom plate and the side plate of the surface is a continuous structure.

In an embodiment of the invention, a thickness of the second carrier is about 0.05 mm to about 0.6 mm.

In an embodiment of the invention, a depth of the notch is substantially smaller than or substantially equal to ⅔ of the thickness of the second carrier, and is substantially greater than or substantially equal to ½ of the thickness of the second carrier.

In an embodiment of the invention, a material of the first carrier is metal.

In an embodiment of the invention, a material of the second carrier is polyethylene terephthalate (PET).

In an embodiment of the invention, the second carrier is a thermal conductive tape.

In an embodiment of the invention, the second carrier is a cushion material or a foam material.

In an embodiment of the invention, the first carrier and the second carrier are jointed through a rolling process.

In an embodiment of the invention, a temperature provided during the rolling process is substantially smaller than 150° C., which is preferably between about 35° C. and about 100° C.

In an embodiment of the invention, at least one notch is formed on the second carrier, and the second carrier and the first carrier are stamped along the notch, so that one side of the notch forms a bottom plate of the frame, and another side of the notch forms a side plate of the frame.

In an embodiment of the invention, the notch forms a continuous line contour on the second carrier.

In an embodiment of the invention, the notch forms a dotted line contour on the second carrier.

According to the above descriptions, by integrally forming the first carrier and the second carrier, not only structures and functions of the OLED display panel and the carrier are maintained, a process flow thereof can be greatly simplified to effectively reduce the fabrication cost. Moreover, based on the notch feature on the second carrier, the distance of the notch relative to the first carrier is greater than the distance of the continuous joint surface relative to the first carrier, so that after the first carrier and the second carrier are bonded, the frame structure used for carrying the OLED display panel can be smoothly formed.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
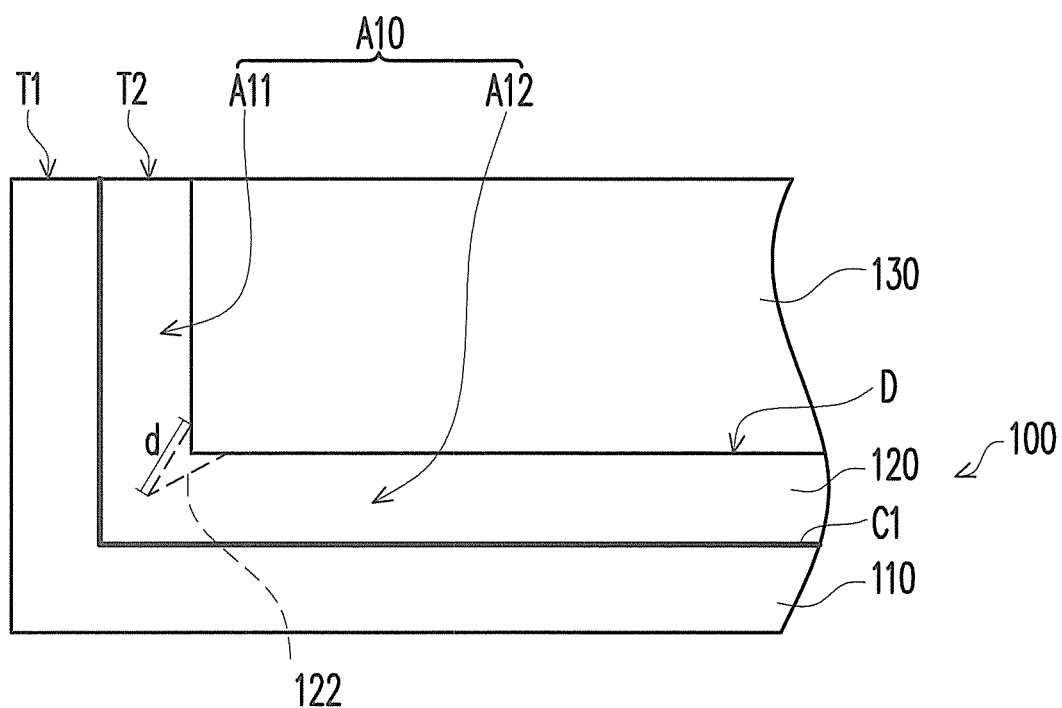
FIG. 1 is a cross-sectional view of an organic light emitting diode (OLED) display module according to an embodiment of the invention.

FIG. 1 is a cross-sectional view of an organic light emitting diode (OLED) display module according to an embodiment of the invention. Referring to FIG. 1, the OLED display module 100 includes a first carrier 110, a second carrier 120, and an OLED display panel 130. The second carrier 120 is disposed on the first carrier 110 and is formed integrally with the first carrier 110. The OLED display panel 130 is disposed on the second carrier 120. Moreover, a continuous joint surface C1 is fowled between the first carrier 110 and the second carrier 120, and the continuous joint surface C1 is a contact and joint surface of the first carrier 110 and the second carrier 120. In other words, in the present embodiment, the first carrier 110 and the second carrier 120 are jointed to commonly foam a carrier structure for assembling the OLED display panel 130, so that the carrier structure used for carrying the OLED 130 and a manufacturing process thereof can be effectively simplified based on the integral structure of the first carrier 110 and the second carrier 120. In this way, manufacturing cost of the OLED display module 100 can be effectively reduced.

In detail, in the present embodiment, the first carrier 110 and the second carrier 120 form a frame A10, and the OLED display panel 130 is disposed in the frame A10. The frame A10 has a bottom plate A11 and a side plate Alt adjoined to the bottom plate A11, and a notch 122 is located between the bottom plate A11 and the side plate A12. Here, a material of the first carrier 110 is, for example, metal, which serves as a main supporting structure of the frame A10, and a material of the second carrier 120 is, for example, polyethylene terephthalate (PET), which provides a support function and a protection function to the OLED display panel 130 carried thereon. The material or type of the second carrier 120 is not limited by the present embodiment, and in other embodiments that are not illustrated, the second carrier can also be a thermal conductive tape (for example, Whayueb FCT-730-25), a cushion material (or namely buffer material, for example, Poron: SRS70P/SRS48P, S&K: Polyte PSR-02, Iwatani: ISR-ACF or Nitto: SCF) or a foam material, so as to achieve a cooling and a cushion (or namely buffer) effects for the OLED display panel 130.

Moreover, the second carrier 120 may selectively have at least one notch 122, and the notch 122 can be located on a surface D of the second carrier 120 back to the first carrier 110, so as to facilitate the first carrier 110 and the second carrier 120 forming the frame A10, and reduce a material squeezing phenomenon. The expression "back to" refers to that the notch 122 is located on a contact surface (an inner surface) of the frame A10 and the panel 130, i.e. the surface D of the second carrier 120 that is not contacted to the first carrier 110 serves as the surface (the inner surface) of the frame A10. Moreover, a distance of the notch 122 relative to the first carrier 110 is substantially greater than a distance of the continuous joint surface C1 relative to the first carrier 110, and a depth d of the notch 122 on the second carrier 120 does not reach the continuous joint surface C1 between the first carrier 110 and the second carrier 120, so that a joint effect of the first carrier 110 and the second carrier 120 is not influenced. However, the invention is not limited thereto, and in another embodiment that is not illustrated, a joint of the bottom plate and the side plate of the surface of the second carrier 120 back to the first carrier 110 can also be a continuous structure, namely, the notch is unnecessary to be formed on the second carrier 120 in such embodiment.

Moreover, the first carrier 110 and the second carrier 120 are aligned at the side plate A12, namely, heights of the tops T1 and T2 of the side plate A12 formed by the first carrier 110 and the second carrier 120 relative to the bottom plate A11 are substantially the same, and a thickness of the second carrier 120 is about 0.05 mm to about 0.6 mm. Compared to a conventional frame structure, the OLED display module 100 of the invention has a light and slim appearance.

Figure 2:
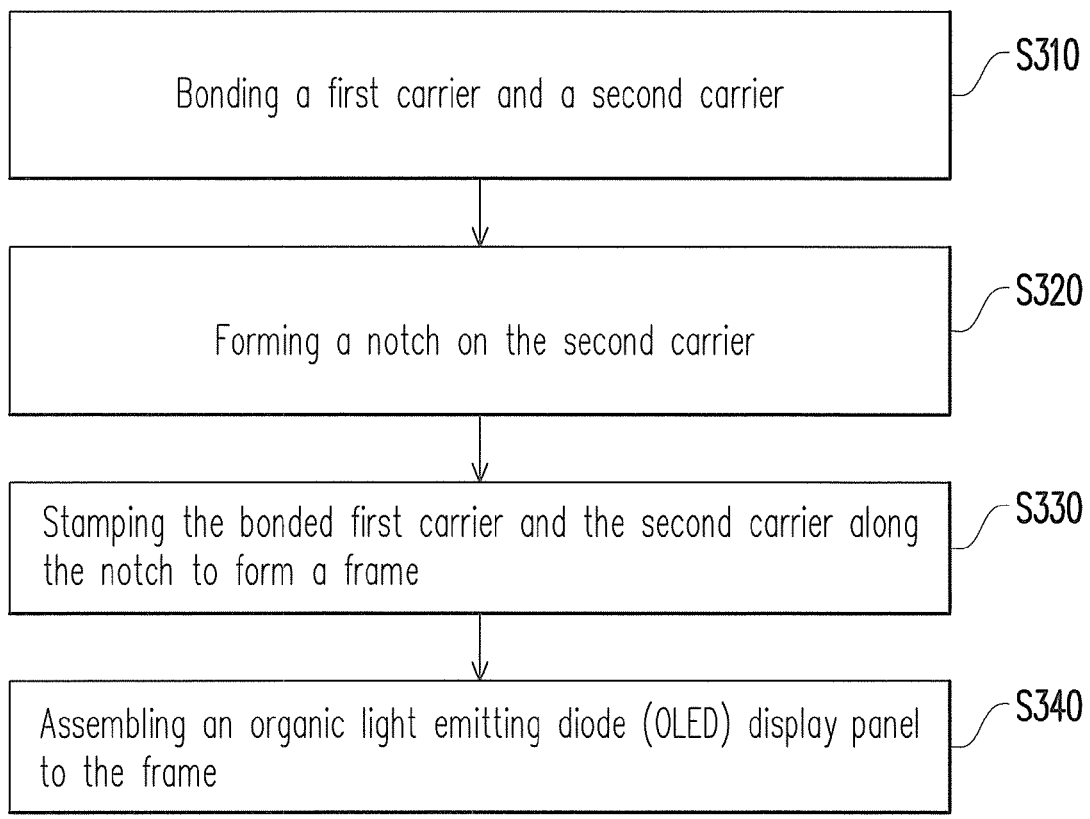
FIG. 2 is a flowchart illustrating a method for manufacturing the OLED display module of FIG. 1.
Figure 3A:
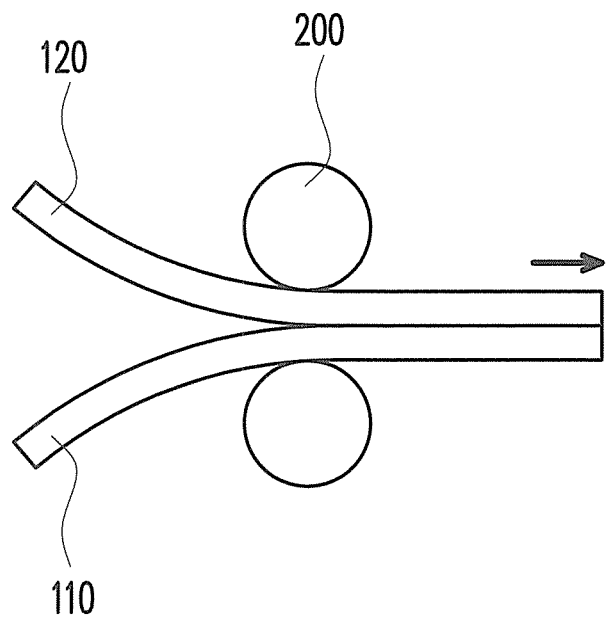
FIGS. 3A-3C are schematic diagrams of the method for manufacturing the OLED display module of FIG. 2.
Figure 3B:
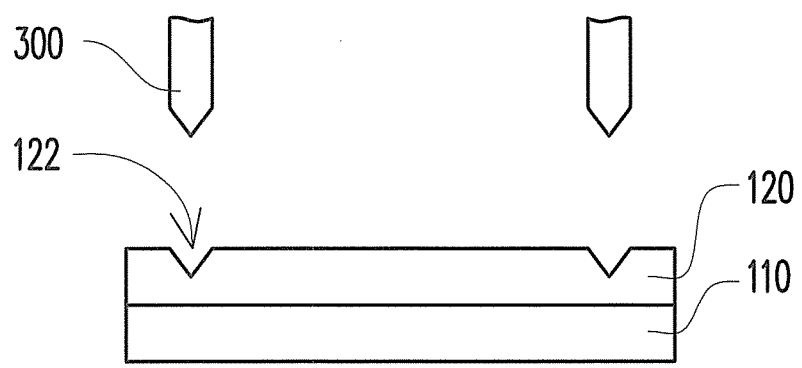
Figure 3C:
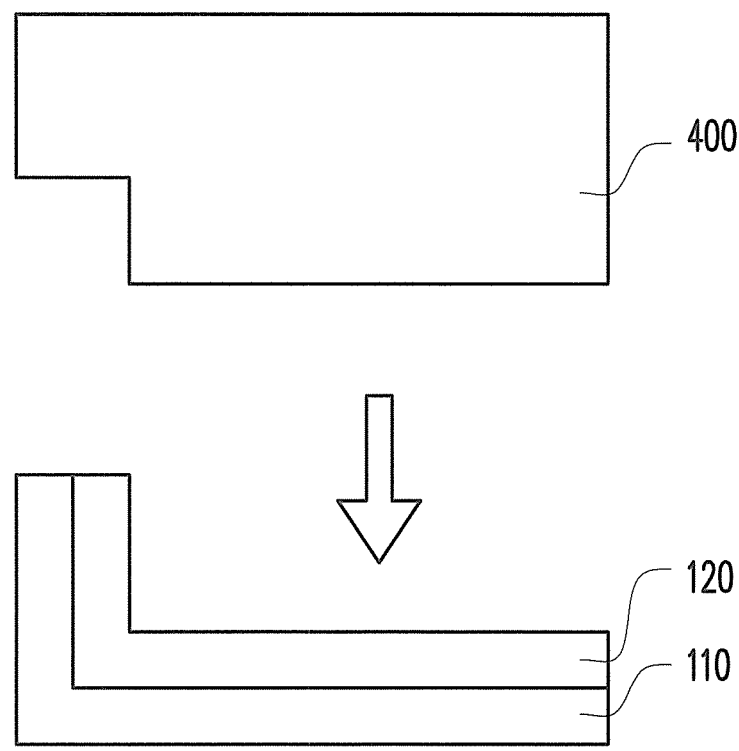

FIG. 2 is a flowchart illustrating a method for manufacturing the OLED display module of FIG. 1. FIGS. 3A-3C are schematic diagrams of the method for manufacturing the OLED display module of FIG. 2. Referring to FIG. 2, FIG. 3A to FIG. 3C, in step S310, the first carrier 110 and the second carrier 120 are jointed. For example, the first carrier 110 and the second carrier 120 can be jointed through a rolling machine 200, and a temperature provided during the rolling process is substantially smaller than 150° C., which is preferably between about 35° C. and about 100° C. Then, in step S320, a cutting tool 300 is used to form the notch 122 on the second carrier 120, where a depth of the notch 122 is substantially smaller than or substantially equal to ⅔ of the thickness of the second carrier 122, and is substantially greater than or substantially equal to ½ of the thickness of the second carrier 120. Then, in step S330, a stamping machine 400 is used to stamp the bonded first carrier 110 and the second carrier 120 along the notch 122 to form the frame A10 (shown in FIG. 1), wherein one side of the notch 122 forms the bottom plate A11 of the frame A10, and another side of the notch 122 forms the side plate A12 of the frame A10. In other words, the notch 122 on the second carrier 120 avails formation of the frame A10 (i.e. the inner surface of the side plate A12 can be smoothly bended towards the inner surface of the bottom plate A11). Moreover, a size of the stamped frame A10 can be adjusted through the notch 122, so as to align the first carrier 110 and the second carrier 120 at the side plate A12.

Figure 4A:
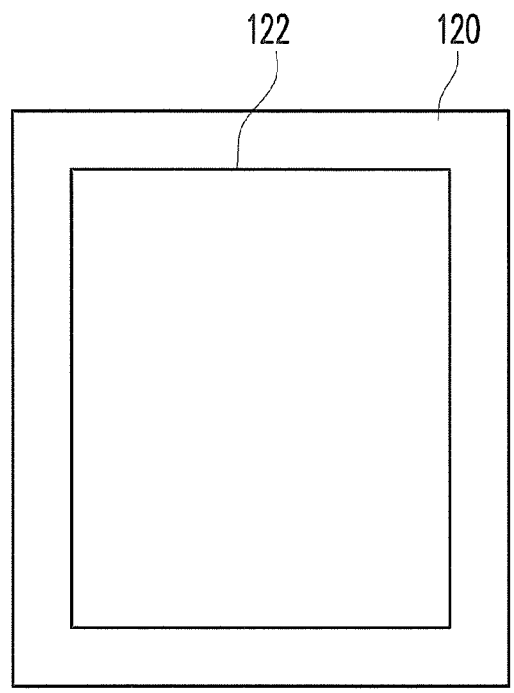
FIG. 4A is a top view of the OLED display module of FIG. 3B.
Figure 4B:
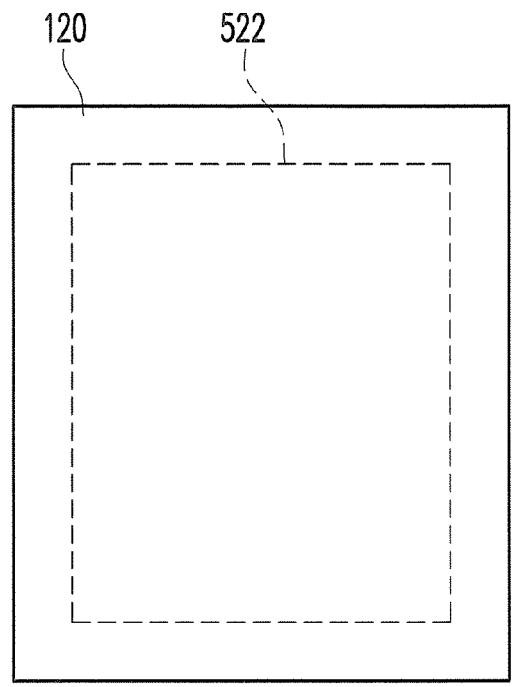
FIG. 4B is a top view of an OLED display module according to another embodiment of the invention.

Moreover, FIG. 4A is a top view of the OLED display module of FIG. 3B. Referring to FIG. 3B and FIG. 4A, in the present embodiment, the notch 122 forms a continuous line contour on the second carrier 120. However, the invention is not limited thereto, and FIG. 4B is a top view of an OLED display module according to another embodiment of the invention, and in FIG. 4B, a notch 522 forms a dotted line contour on the second carrier 120 to achieve the same effect as that described above, which can be suitably changed by an operator according to an actual manufacturing condition. Finally, in step S340, the OLED display panel 130 is assembled to the frame A10. In this way, fabrication of the OLED display module 100 is completed.

In summary, by integrally forming the first carrier and the second carrier, not only structures and functions of the OLED display panel and the carrier are maintained, a process flow thereof can be greatly simplified to effectively reduce the fabrication cost. Moreover, based on the notch feature on the second carrier, the distance of the notch relative to the first carrier is substantially greater than the distance of the continuous joint surface relative to the first carrier, so that after the first carrier and the second carrier are jointed, the frame can be smoothly formed through stamping, so as to facilitate fabricating the OLED display module.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An organic light emitting diode (OLED) display module, comprising:
   a first carrier;

a second carrier, disposed on the first carrier and formed integrally with the first carrier, wherein a continuous joint surface is formed between the first carrier and the second carrier; and an OLED display panel, disposed on the second carrier, wherein the second carrier has at least one notch, a distance of the notch relative to the first carrier is substantially greater than a distance of the continuous joint surface relative to the first carrier, and a thickness of the second carrier is about 0.05 mm to about 0.6 mm.

2. The OLED display module of claim 1, wherein the first carrier and the second carrier form a frame, and the frame has a bottom plate and a side plate adjoined to the bottom plate, and the notch is located between the bottom plate and the side plate.

3. The OLED display module of claim 2, wherein the first carrier and the second carrier are aligned at the side plate.

4. The OLED display module of claim 2, wherein the second carrier comprises a surface back to the first carrier, and a joint of the bottom plate and the side plate of the surface is a continuous structure.

5. The OLED display module of claim 1, wherein a depth of the notch is substantially smaller than or substantially equal to ⅔ of the thickness of the second carrier, and is substantially greater than or substantially equal to ½ of the thickness of the second carrier.

6. The OLED display module of claim 1, wherein a material of the first carrier is metal.

7. The OLED display module of claim 1, wherein a material of the second carrier is polyethylene terephthalate (PET).

8. The OLED display module of claim 1, wherein the second carrier is a thermal conductive tape.

9. The OLED display module of claim 1, wherein the second carrier is a cushion material or a foam material.

10. A method for manufacturing an organic light emitting diode (OLED) display module, comprising:

jointing a first carrier and a second carrier;

stamping the first carrier and the second carrier to form a frame;

assembling an OLED display panel to the frame;

forming at least one notch on the second carrier; and stamping the second carrier and the first carrier along the notch, so that one side of the notch forms a bottom plate of the frame, and another side of the notch forms a side plate of the frame, wherein the notch provides a contour to the second carrier in the form of a dotted line.

11. The method for manufacturing the OLED display module of claim 10, wherein the first carrier and the second carrier are jointed through a rolling process.

12. The method for manufacturing the OLED display module of claim 11, wherein a temperature provided during the rolling process is substantially less than 150° C.

13. The method for manufacturing the OLED display module of claim 12, wherein the temperature provided during the rolling process is substantially between 35° C. and 100° C.

\* \* \* \* \*